United States Patent [19]

Ng et al.

[11] Patent Number: 5,847,616

[45] Date of Patent: Dec. 8, 1998

[54] EMBEDDED VOLTAGE CONTROLLED OSCILLATOR WITH MINIMUM SENSITIVITY TO PROCESS AND SUPPLY

[75] Inventors: Maisy Mun Lan Ng; Kheng Boon Peh; Jie Liang, all of Singapore, Singapore

[73] Assignee: Tritech Microelectronics International, Ltd., Singapore, Singapore

[21] Appl. No.: 764,287

[22] Filed: Dec. 12, 1996

[51] Int. Cl.[6] .............................. H03B 5/04; H03B 5/24
[52] U.S. Cl. .............................. 331/57; 331/34; 331/175; 331/177 R
[58] Field of Search .................. 331/1 A, 8, 17, 331/25, 34, 57, 175–176, 177 R; 327/105–107, 156–159

[56] References Cited

U.S. PATENT DOCUMENTS

| | | | |
|---|---|---|---|
| 5,061,907 | 10/1991 | Rasmussen | 331/57 |
| 5,412,349 | 5/1995 | Young et al. | 331/57 X |
| 5,440,277 | 8/1995 | Ewen et al. | 331/57 X |
| 5,523,723 | 6/1996 | Arcus et al. | 331/57 X |
| 5,581,216 | 12/1996 | Ruetz | 331/57 |
| 5,686,867 | 11/1997 | Sutardja et al. | 331/57 |

OTHER PUBLICATIONS

Yang et al. "A PLL Clock Generator with Sto 110 Mhz of Lock Range for Microprocessors", IEEE Journal of Solid State Circuits, vol. 27, Nov. 11, 1992 pp.1599–1607.

Primary Examiner—David Mis
Attorney, Agent, or Firm—George O. Saile; Stephen B. Ackerman; Billy Knowles

[57] ABSTRACT

The present invention provides a voltage controlled oscillator with improved noise immunity and minimized variation due to manufacturing process, power supply and operating temperature changes. The voltage controlled oscillator consists of fully differential connected ring oscillator that includes a plurality of differentially connected delay elements. The ring oscillator responds to a control current signal for controlling the frequency of oscillation. A voltage to current converter converts the input tuning voltage to an output current for the controlling of the ring oscillator. The delay element consists of two source coupled P-channel transistors connected to a current source. The drains of the P-channel transistors are each connected to a voltage controlled impedance that changes the delay characteristics of the delay element in response to the input tuning voltage. A voltage reference generator provides the reference voltage necessary to determine the amplitude out of the delay element and is insensitive to variations due to manufacturing process, power supply, and operating temperature. A fully differential comparator provides symmetrical loading for the ring oscillator and the high gain necessary to provide the output drive capability.

24 Claims, 5 Drawing Sheets

FIG. 2 – Prior Art

EMBEDDED VOLTAGE CONTROLLED OSCILLATOR WITH MINIMUM SENSITIVITY TO PROCESS AND SUPPLY

BACKGROUND OF THE INVENTION

1. Field of the Invention

The present invention relates to frequency synthesizers and voltage controlled oscillators and, in particular, to integrated circuits for obtaining a variable frequency voltage output that is insensitive to manufacturing process, power supply, and operating temperature variation.

2. Description of Related Art

As shown in FIG. 1. a basic phase lock loop system 10 includes three basic elements—a Phase Detector 14, a Loop Filter 18, and a Voltage Controlled Oscillator 22—interconnected to form a feedback system that will adjust the output frequency based on the External Reference Signal 12. The External Reference Signal 12 is compared with the Output Frequency 24 in the Phase Detector 14 which generates an error voltage signal Vd 16. This signal is filtered in the Loop Filter 18 to provide a Control Voltage 20 to a Voltage Controlled Oscillator (VCO) 22.

The VCO is the critical component of the Phase Lock Loop System 10. The output frequency $V_{o(t)}$ 24 is dependent on the input voltage $V_c$ 20. The Vco gain (Kvco) is the ratio of the output frequency $V_{o(t)}$ 24 to the input voltage $V_c$ 20. The linearity of the voltage to frequency conversion of the Phase Lock Loop System 10 is dependent on the stability and control characteristics of the VCO 22. The VCO 22 is an analog circuit that must be immune to on chip noise sources and power supply, manufacturing process, and operating temperature variation.

One example of a VCO design is described by Young et al., "A PLL Clock Generator with 5 to 110 Mhz of Lock Range for Microprocessors", IEEE Journal of Solid State Circuits, Vol 27, Nov. 11, 1992. The Young et al. PLL in FIG. 2. features a VCO that is based on a Ring Oscillator 250 that is formed of from one to five stages of a Current Controlled Differential Delay Element (CCDDE) 200. The CCDDE 200 consists of two P-Channel Metal Oxide Semiconductor (MOS) Field Effect Transistors (FET) 202 that are source coupled and connected to the Current Source I 204 and the drains are loaded with a Voltage Controlled Resistor (VCR) 206. Delay through the CCDDE 200 is controlled by the current through the Current Source I 204, differential voltage swing and the capacitance of the Output Load +OUT, −OUT.

FIG. 3. illustrates the Voltage Controlled Resistor (VCR) circuit. The voltage RCONTROL 330 controls the impedance of the N-channel MOS FET's T1 300 and T2 310 and thus the current at the node IN 340. The N-channel MOS FET T2 310 is added in series with the N-channel MOS FET T3 320 to a achieve a high dynamic range for the change of the resistance with the change in the voltage RCONTROL 330.

To control the frequency of the Differential Delay Element VCO described in FIG. 2., the VCO Control Voltage 246 must be converted to a current. This is accomplished in the Voltage to Current Converter 240 which is realized by connecting a MOS T2 244 as a source follower. A voltage of (VCOIN-Vt) is applied across resistor R1 245, where Vt is the threshold voltage of transistor T2 244. The voltage CURRENT BIAS 248 provides the Voltage Reference for the CCDDE current sources 204.

The signal amplitude is held constant by means of the Replica Biasing Circuit 210 and a power supply independent Voltage Reference Generator 230. The configuration of the Replica Biasing Circuit 210 uses an operational amplifier 212 and a copy of the CCDDE 200 to generate the appropriate bias voltage to set the VCR's 206 to their correct value. The configuration of the Replica Biasing Circuit 210 forces the magnitude of the output swing of the CCDDE 200 to be equal to Vref 232.

The impact of Vt, the threshold voltage of transistor T2 244 is that the VCO would not be operational over the full range of VCOIN voltages, particularly at VCOIN voltages which are smaller than the threshold voltage needed to turn on transistor T2 244. A secondary impact of the prior art voltage-to-current converter not operating at low VCOIN voltages is that the low current bias set up in the Replica Biasing Circuit 210 results in a large output impedance in transistor T3 214 and VCR 216. This causes instability in the amplifier formed by operational amplifier 212, transistor T3 214 and VCR 216. The RCONTROL line 209 thus oscillates and the VCO performance is greatly impaired at low VCOIN voltages.

An Amplifier 220 converts the small signal output of the final stage of the Ring Oscillator 250 to a level necessary to drive external circuitry.

In integrated circuit realizations of the prior art VCO where the voltage-to-current converter resistor R1 245 may be made of material such as p+ diffusion or n-well diffusion, the VCO gain Kvco will vary too greatly (as the value of R1 245 varies over process and operating temperature) as to make VCO circuit optimization difficult.

SUMMARY OF THE INVENTION

An object of this invention is a voltage controlled oscillator that will generate an output signal having a frequency that will have a variation that is proportional to an input voltage level.

Another object of this invention is a voltage controlled oscillator that is immune to external noise disturbances and variations in the semiconductor manufacturing process, fluctuations in the power supply voltage source, and changes in operating temperature, comprising:

To accomplish these and other objects a Voltage Controlled Oscillator (VCO) has a plurality of fully Differential Delay Elements configured to form a Ring Oscillator. The frequency of the Ring Oscillator is controlled by the delay of the Differential Delay Element which is controlled by the current through the delay element, the voltage swing within the delay element, and the capacitance loading on each delay element output. The voltage swing within the delay element is controlled to a constant value with a Voltage Controlled Impedance by a Voltage Reference Generator and a Biasing Circuit that will compensate for any variation in power supply, manufacturing process, and operating temperature.

The Differential Delay Element consists of two source coupled FET's connected to a current source. The output voltage of the Differential Delay Element is controlled by the Voltage Controlled Impedance connected to each drain of the FET's.

The output of the final stage of the Ring Oscillator is the input to a voltage comparator configured to provide symmetrical loading to reduce the harmonic distortion in the Ring Oscillator. The two parallel input amplifiers of the voltage comparator are biased in the high gain region to compare the smallest input voltage signals at the highest frequencies.

DETAILED DESCRIPTION OF THE INVENTION

Figure 1:
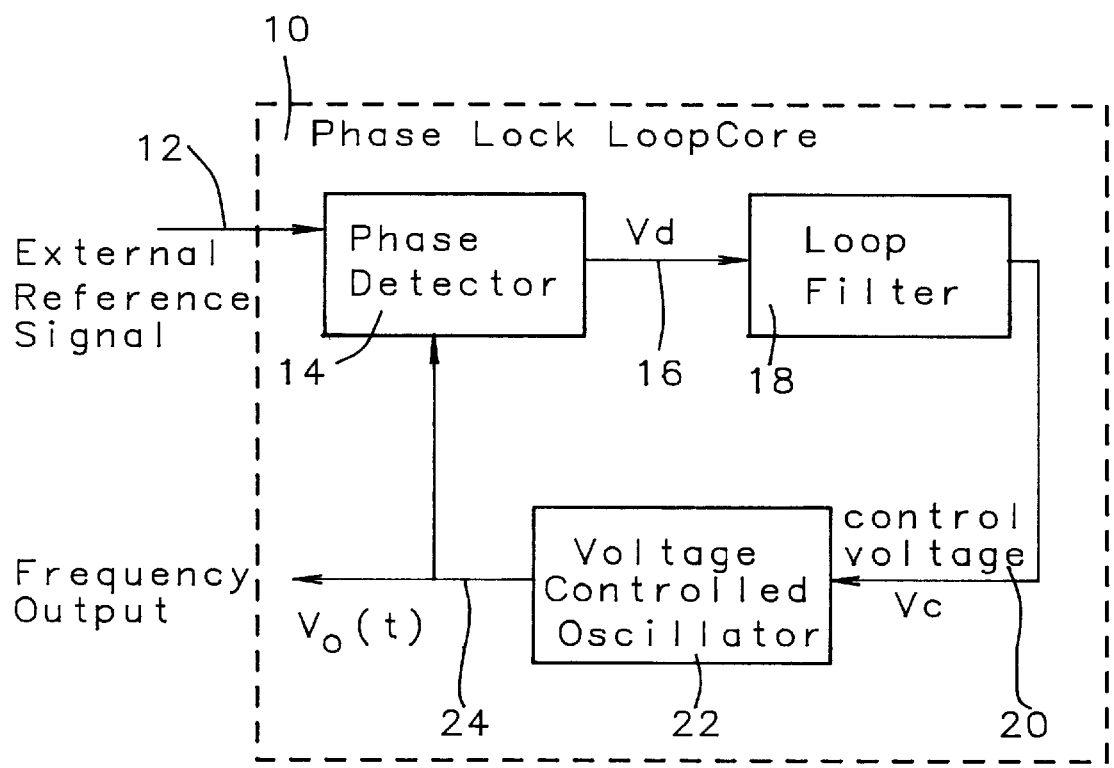
FIG. 1. is a block diagram illustrating the basic core of a phase lock loop.
Figure 2:
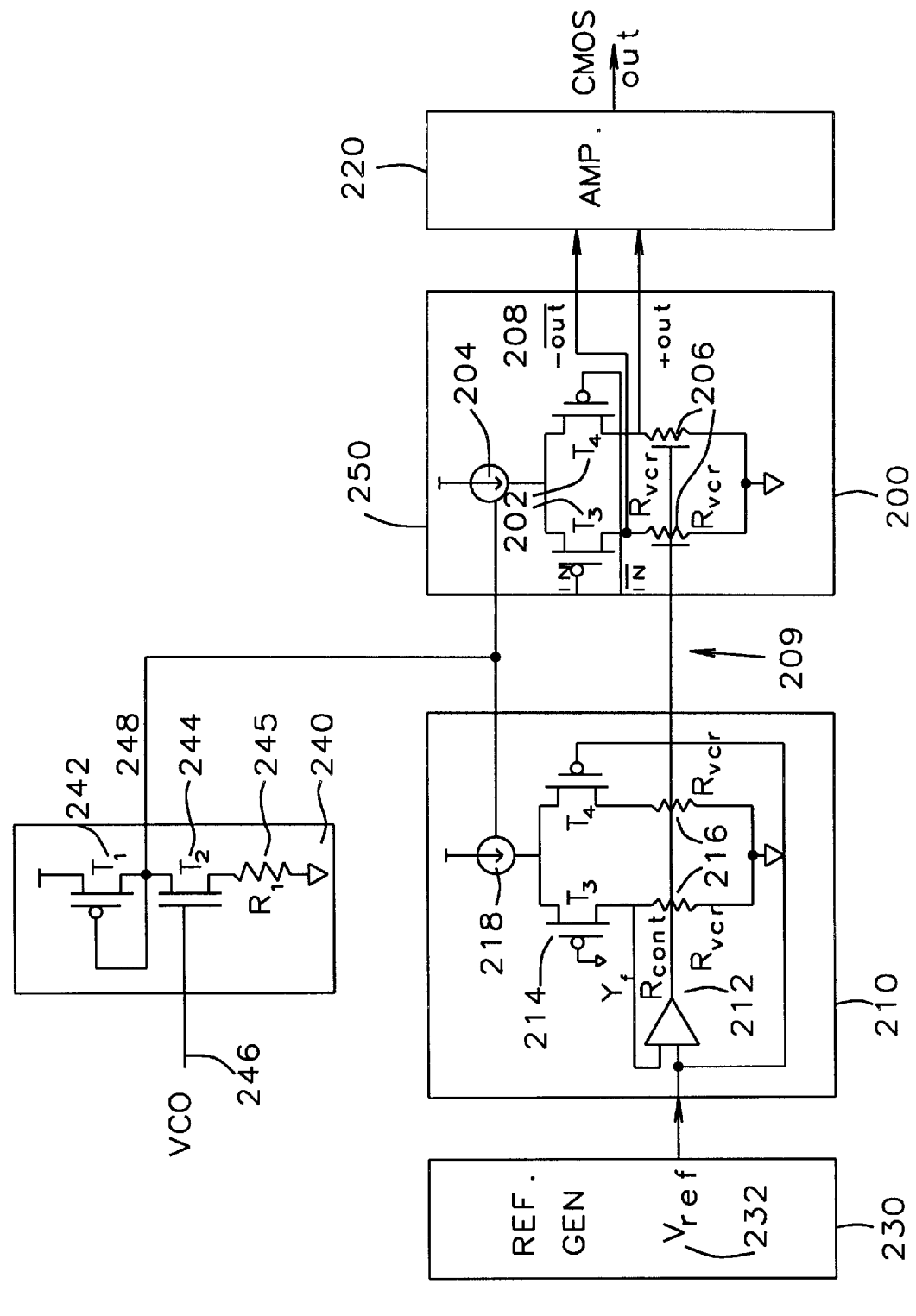
FIG. 2. is diagram of the prior art for the differential delay element VCO.
Figure 4:
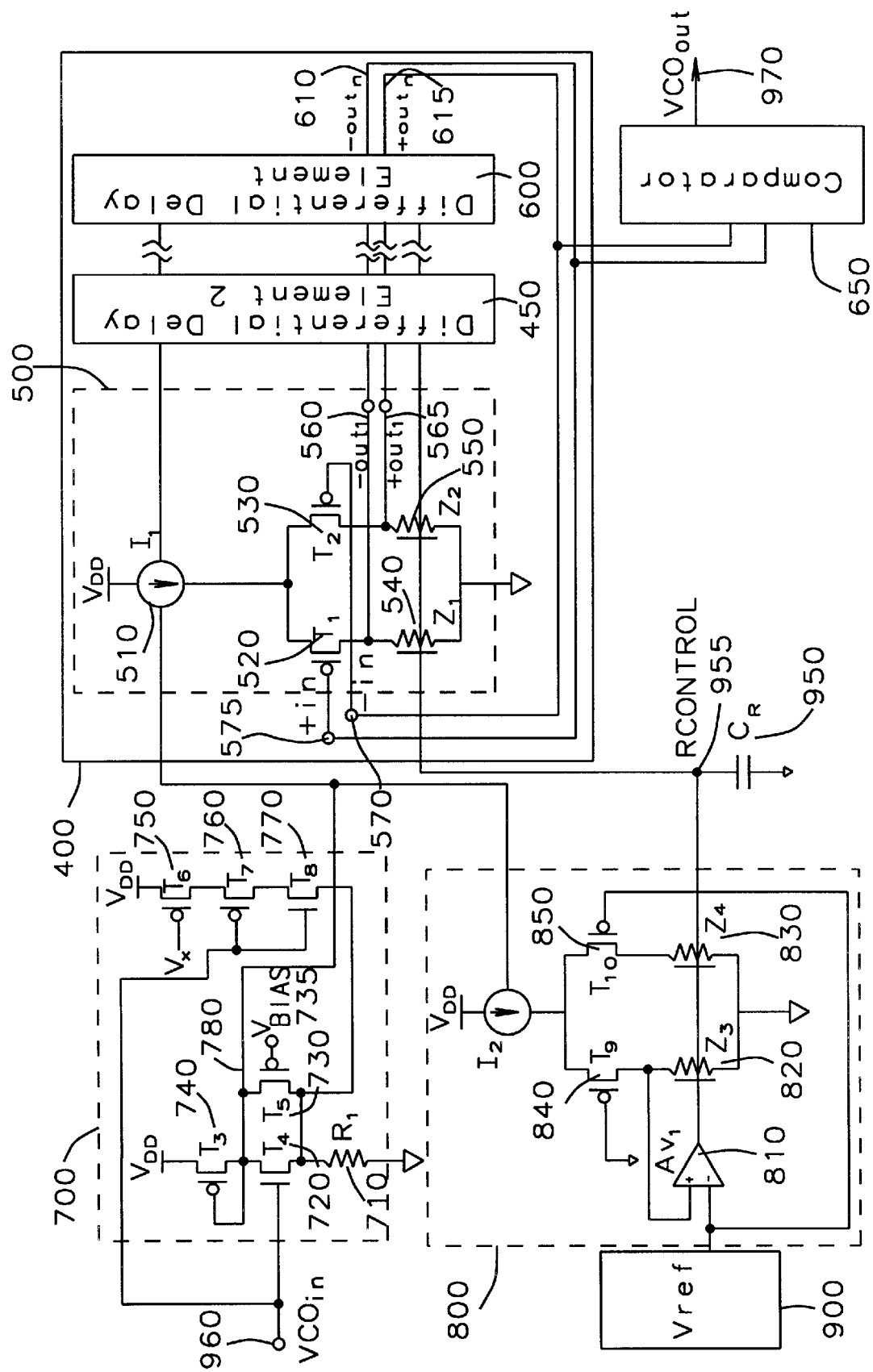
FIG. 4. is a diagram illustrating an embodiment of the VCO in accordance with the present invention.

In FIG. 1. the output of the Loop Filter 18 acts as a Voltage Input 20 to the frequency output of the VCO 22. In FIG. 4. the VCOin 960 is the controlling voltage for the VCO. This voltage is converted to current in the Voltage to Current (V-I) Converter 700. An n-channel transistor T4 720 functions as a source follower and hence a voltage of (VCOIN-Vt) is applied across resistor R1 710, where Vt is the threshold voltage of transistor T4 720. The Current Bias 780 has a minimum that is established by the source-to-drain current through p-channel transistor T5 730 by the voltage Vbias 735. As is known in the art, the current through transistor T5 730 is dependant on the voltage Vbias 735, the geometry (gate length and gate width) of the transistor T5 730 and the doping profile of the impurities used to create the transistor T5 730. (The voltage Vbias 735) may be a fixed voltage so as to give a constant current (regardless of the VCOIN voltage) or may be tied to VCOIN 960 in order to give a current that varies inversely with the input voltage VCOIN 960.

As VCOin 960 decreases the impedance of T4 720 increases to the level such that the source-to-drain current set up by T5 730 dominates the voltage set up at the Current Bias 780 node. As is known in the art, the current through the resistor R1 710 will vary for a specific level of VCOin 960 according to variations in power supply VDD and operating temperature, since the resistance of the resistor R1 710 is dependent on the operating temperature and the current through the resistor R1 710 is a function of the power supply $V_{DD}$. Further, the current through the resistor R1 710 will vary from manufacturing lot to manufacturing lot for multiple integrated circuit chips containing the VCO of this invention. If the manufacturing process is what is termed "fast" the sheet resistance of the resistor R1 710 is decreased and the current through the resistor R1 710 is increased. However, if the manufacturing process is what is termed "slow" the sheet resistance of the resistor R1 710 is increased and the current through the resistor R1 710 is decreased. These variations in the current through the resistor R1 710 cause the Current Bias 780 voltage to vary and thus the frequency of the VCO. Additionally, the impedance of the transistors T6 750, T7 760, and T8 770 act as a mirroring circuit to compensate for the varying amount of current set up across resistor R1 710 by VCOin 960 as manufacturing process, power supply, and operating temperature varies.

An additional advantage of a constant minimum current set up by a fixed Vbias voltage at transistor T5 730 is a minimum oscillation frequency that it sets up in the ring oscillator. Increasing VCOIN voltage will increase the oscillation frequency above this minimum frequency. This allows the ring oscillator to operate optimally in applications where a narrow band of high frequencies is required. In the absence of the minimum current set up by transistor T5 730, the narrow band of high frequencies can only be generated by a VCO with high VCO gain. However, the VCO performance will not be optimized since only a narrow band of frequencies generated are of interest and the high VCO gain will actually increase VCO noise.

The gate of the transistor T6 750 is connected to the bias voltage source Vx. The value of the bias voltage source Vx is set so as the transistor T6 750 functions as a current source. The transistors T7 760 and T8 770 have their gates connected to the VCOin 960. For a selected value of the voltage at the VCOin 960 line, any variation in the current through the transistors T6 750, T7 760, and T8 770 due to the variations in power supply voltage $V_{DD}$ or operating temperature, or even between VCO's of different manufacturing lots will be counter to the changes in current in the transistor T3 740 and T4 720. Thus, transistors T6 750, T7 760, and T8 770 performs current subtraction from transistor T3 740 that sets up the Current Bias 780 voltage. The magnitude of the VCO gain Kvco varies with process. For example in the case of a resistor R1 710 made of p+ diffusion, a "fast" process would result in a lower p+ sheet resistance and a larger current set up across R1 710 for a given VCOIN 960 voltage. In the absence of transistors T6 750, T7 760, and T8 770, the entire larger current would be drawn out of transistor T3 740 and the resultant Current Bias 780 voltage would be replicated in the entire ring oscillator. Hence a larger current flows through the ring oscillator and the VCO gain Kvco increases. For a ring oscillator designed to work at a certain output frequency range, an increase in Kvco means a compression of the working voltage range of VCOIN and potentially larger jitter due to noise on the VCOIN line.

With the addition of transistors T6 750, T7 760, and T8 770, part of the increased current set up in resistor R1 710 in a "fast" process would be drawn from these transistors rather than from transistor T3 740. This "current subtraction" results in a smaller current value being replicated in the ring oscillator and a smaller Kvco increase for the "fast" process. The "faster" the process, the larger the current would be set up across resistor R1 710 and the larger the amount of current subtraction performed by transistors T6 750, T7 760, and T8 770. Similarly, the "slower" the process, the smaller the current across resistor R1 710 and the smaller the current subtraction by transistors T6 750, T7 760, and T8 770

Figure 3:
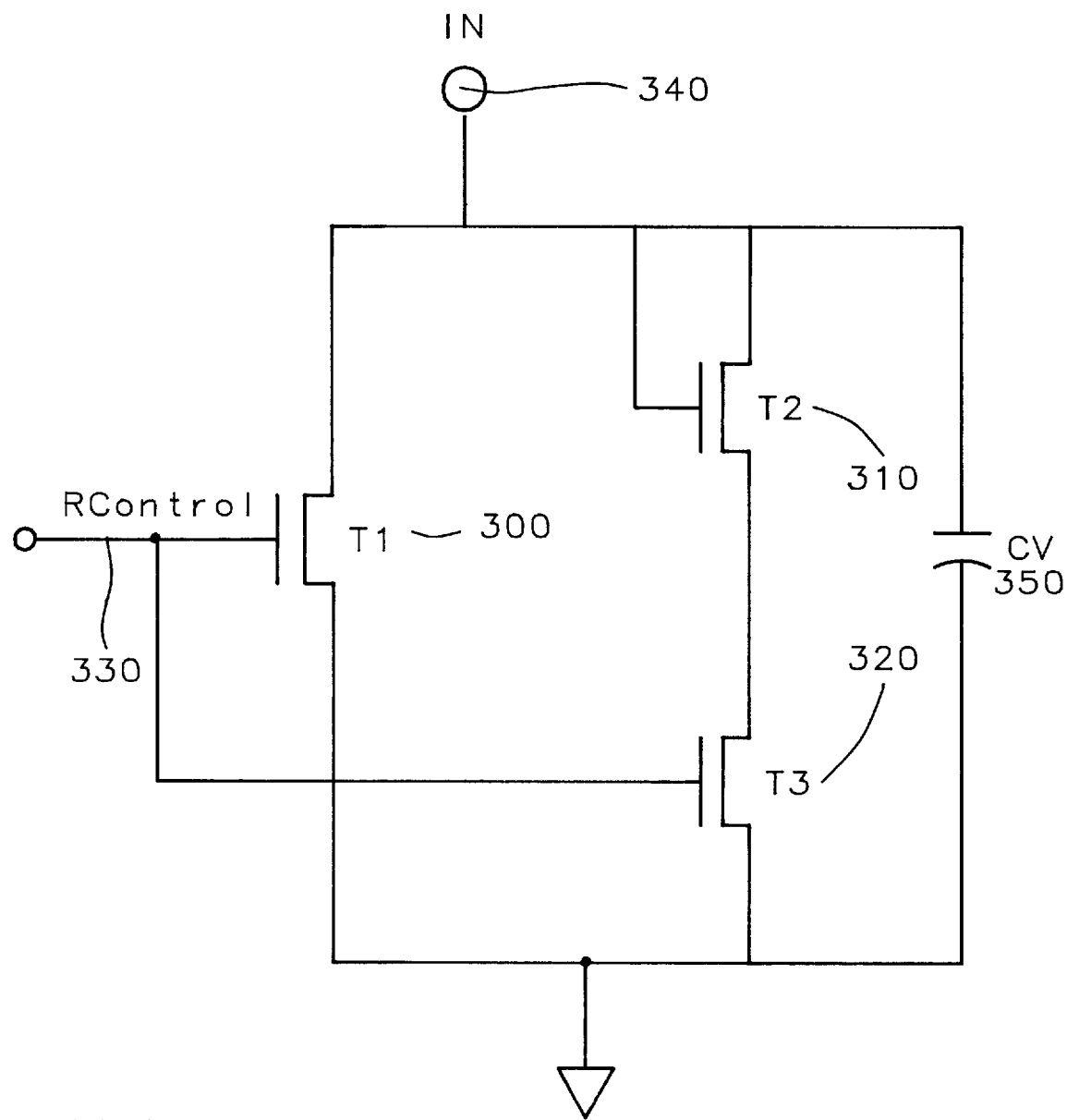
FIG. 3. is a schematic of a voltage controlled resistor.

In FIG. 4. the Ring Oscillator 400 is comprised of a plurality of Differential Delay Elements (DDE)450,500,600 configured such that the output of the final stage is fed back to the first stage. The delay of total Ring Oscillator 400 is such that feedback signal is in phase with the input for only one frequency at which the circuit will oscillate. Each DDE 500 consists of a two P-channel MOSFET's T1 520 and T2 530 that are source coupled and connected at their sources to Current Source $I_1$ 510 and at their drains to VCI Z1 540 and Z2 550. The outputs +$OUT_1$ 565 and -$OUT_1$ 560 are connected to the input of the following DDE. The outputs of the final DDE 600 +$OUT_n$ 610 and -$OUT_n$ 615 are fed back as inputs to the first DDE 500 and to the input of the Output Comparator Amplifier 650. The VCI's Z1 and Z2 operate as voltage controlled resistors illustrated in FIG. 3. An optional Capacitor CV 350 may be connected in the voltage controlled resistor of FIG. 3 between IN 340 and ground. The value of CV 350 is chosen to be larger than the parasitic junction capacitances seen at the common drain connection -$OUT_1$-560 of the VCI Z1 540, and the p-channel transistor T1 520 and +$OUT_1$ 565 and the p-channel transistor $T_2$ 530. The value of CV 350 will then dominate the delay characteristics of the delay chain and the output frequency will vary less with parasitic capacitance as process, operating voltage and temperature changes.

The Voltage Reference Generator (Vref) 900 provides a voltages that is independent of manufacturing process, power' supply, and operating temperature variations. The Vref 900 can be implemented in a variety of methods such as a bandgap reference which Is very stable with respect to semiconductor manufacturing, power supply variation, and temperature variations.

The amplitude of the outputs +OUT$_1$ 560 and −OUT$_1$ 565 of the DDE 500 is determined by the VCI's Z1 540 and Z2 550 which are controlled by Rcontrol 955. Capacitor CR 950 is connected between Rcontrol 955 and ground and acts to stabilize the voltage at Rcontrol 955. The control of the level of Rcontrol 955 is established by Operational Amplifier 810 within the replica biasing circuit 800. The gate of transistor T9 840 is connected to ground and the gate of transistor T10 850 is connected to Vref 900. The entire current in Current Source 1$_2$ 860 thus flows through transistor T9 840. The amplifier gain is set sufficiently high as to cause the feedback at the drain of Z3 820 to be equal to the voltage Vref 900. The voltage Rcontrol 955 then forces the amplitude of the output swings +OUT$_1$ 565 and −OUT$_1$ 560 of the DDE 500 (and also for all output swings of all the DDEs in the entire ring oscillator) to replicate the value of Vref 900.

Figure 5:
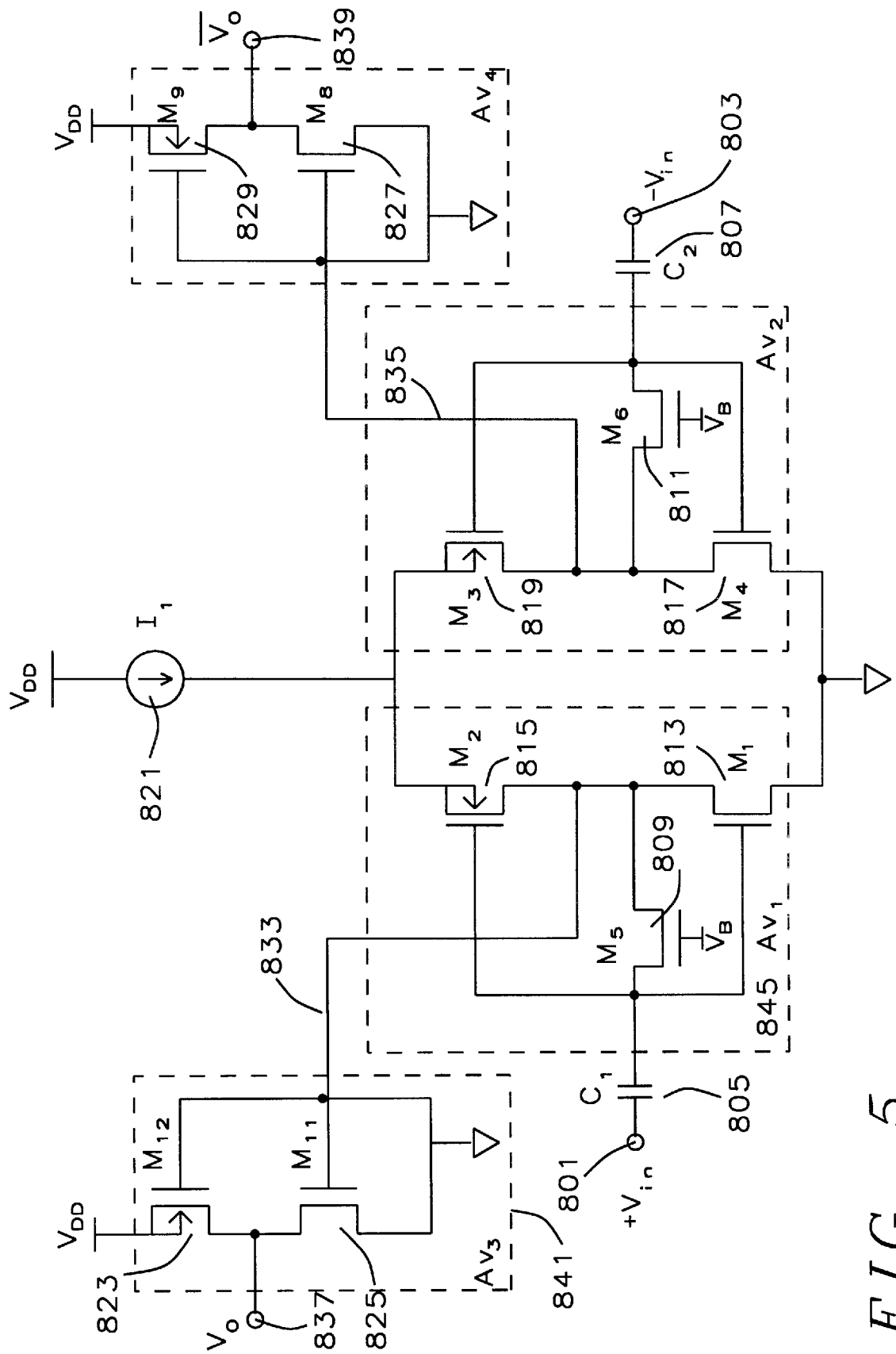
FIG. 5. is schematic to the VCO output comparator circuit.

The outputs of the final DDE 600, +OUT$_n$ 615 and −OUT$_n$ 610, is the input to the Comparator 650. In FIG. 5. the Voltage Inputs +Vin 801 and −Vin 803 are AC coupled through Capacitors C1 805 and C2 807 to the inputs of two parallel complementary inverting amplifiers Av1 845 and Av2 847 that are defined by transistors M1 813, M2 815, M4 817, and M3 819 that are biased to the highest gain region by Transistors M5 809 and M6 811. It will be obvious to those skilled in the art that transistors M5 809 and M6 811 may be replaced by resistors. M5 and M6 are actually functioning as resistors in this embodiment. The advantage of using transistors instead of actual resistors is in area. Transistors take up less area compared to resistors of the same resistance value. The outputs of the inverters Av1 833, and Av2 835 are connected to parallel input complementary inverting buffers Av3 841 and Av4 843 defined by transistors M11 825, M12 823, M8 827, and M9 829. The output 837 of the buffer Av3 841 is the output of the phase lock loop V$_o$ 24 of FIG. 1.

The comparator 650 of FIG. 4 is designed to have fully differential inputs to maximize speed of operation and to provide symmetrical loading to the fully differential ring oscillator. The symmetrical loading minimizes harmonic distortion within the ring oscillator and reduces the VCO phase noise.

The speed of the comparator 650 of FIG. 4 is further enhanced through use of simple inverter architecture (Av1, Av2) that is biased in the high gain region. These high gain inverters when used with capacitors C1 805 and C2 807 allow even small signals at inputs at +Vin 801 and −Vin 803 to be successfully compared and converted to CMOS levels at Av1 output 833 and Av2 output 835. The ability of comparator 650 of FIG. 4 to convert small signals allows the ring oscillator to use small signal swings and hence increase oscillation speed. The bias voltage to set the current through the current source I1 821 in the comparator is set up by a bias circuit (not shown) and is the same as the one that sets the bias for the operational amplifier 810 of FIG. 4.

While this invention has been particularly shown and described with reference to the preferred embodiments thereof, it will be understood by those skilled in the art that various changes in form and details may be made without departing from the spirit and scope of the invention.

What is claimed is:

1. A voltage controlled oscillator to generate an output signal having a frequency that will vary proportionally to an input voltage level, comprising:

a) a differential ring oscillator comprising a current bias port, an impedance control port, and a differential output port consisting of a positive output terminal and a negative output terminal, to produce a differential oscillating signal having said frequency and an amplitude, wherein said frequency is modified by a magnitude of a current bias voltage applied to the current bias port, wherein the amplitude is adjusted by an impedance control voltage applied to the impedance control port, and wherein said differential oscillating signal is placed at the differential output port;

b) a voltage to current bias converter to convert the input voltage level to the current bias voltage, having a voltage control terminal to receive the input voltage level and a current bias output terminal connected to the current bias port to transfer the current bias voltage to the differential ring oscillator, wherein said voltage to current bias converter will convert the input voltage level to the current bias voltage which is applied to the current bias port;

c) a replica biasing circuit having a voltage reference input terminal, a current biasing input terminal connected to receive the current bias voltage, a impedance control voltage output terminal connected to the impedance control port, and a control capacitor coupled between the impedance control voltage output terminal and the ground reference point having a value sufficiently large so that the effect of noise disturbances on the impedance control voltage will be effectively decoupled, wherein said replica biasing circuit produces the impedance control voltage such that said impedance control voltage is immune to variations in the semiconductor manufacturing process, fluctuations in the power supply voltage source, and changes in operating temperature;

d) a voltage reference generator to produce a stable reference voltage that is coupled to the voltage reference input terminal of the replica biasing circuit; and e) a comparator circuit having a differential input port to capacitively couple the differential output port of the differential ring oscillator to maximize a response time of the variation of the frequency for a change in the input voltage level and to provide a symmetrical loading for said differential ring oscillator to prevent harmonic distortion, and a positive and a negative output signal terminal connected to external circuitry to produce the output signal from the differential oscillating signal.

2. The voltage controlled oscillator of claim 1 wherein the differential ring oscillator comprises a plurality of serially connected differential delay elements wherein each differential delay element is has a positive input terminal, a negative input terminal, a positive output terminal, a negative output terminal, a current bias input terminal connected to the current bias port, and an impedance control terminal connected to the impedance control port, wherein said differential delay element will create a differential output delay signal between the positive and negative output terminals that is a version of a differential input signal that is delayed in time, and wherein the positive and negative output terminals of a last differential delay element of the plurality of serially connected differential delay elements is cross connected to the positive and negative input terminals of a first differential delay element of the plurality of serially connected differential delay elements.

3. The voltage controlled oscillator of claim 2 wherein the connecting of the positive and negative output terminals of the last differential delay element to the negative and positive terminals of the first differential delay element will cause a feedback that will create the differential oscillating signal.

4. The voltage controlled oscillator of claim 2 wherein each differential delay element of the plurality of serial connected delay elements comprise:

a) a bias controlled current source to adjust the delay of said differential delay element, having a first terminal connected to the power supply voltage source, a second terminal connected to the current bias input terminal and third terminal;

b) a first differential pair of field effect transistors of a first conductivity type to amplify and delay the differential input signals to form the differential output delay signal wherein a source of each field effect transistor the pair of field effect transistors is connected to the third terminal of the bias controlled current source, a first gate is connected to the positive input terminal, a second gate is connected to the negative input terminal and a first output drain is connected to the negative output terminal and a second output drain is connected to the positive output terminal;

c) a first and a second voltage controlled resistor to control the amplitude of the differential output delay signal, having a first resistor terminal of the first voltage controlled resistor connected to the first output drain, a first resistor terminal of the second voltage controlled resistor connected to the second output drain, a second terminal of the first voltage controlled resistor connected to the ground reference point, a second terminal of the second voltage controlled resistor connected to the ground reference point, a third resistor terminal of the first voltage controlled resistor connected to the impedance control terminal, and a third resistor terminal of the second voltage controlled resistor connected to the impedance control terminal.

5. The voltage controlled oscillator of claim 4 wherein the first and second voltage controlled resistors each further comprise:

a) a first field effect transistor of the second conductivity type having a drain connected to the first resistor terminal, a gate connected to the third resistor terminal, and a source connected to the second resistor terminal;

b) a second field effect transistor of the second conductivity type having a drain and a gate connected to the first resistor terminal and a source; and c) an third field effect transistor of the second conductivity type having a drain connected to the second field effect transistor of the second conductivity type, a gate connected to the third resistor terminal, and a source connected to the second resistor terminal.

6. The voltage controlled oscillator of claim 5 wherein the impedance control voltage adjusts the impedance of the first and second field effect transistors of the second conductivity type.

7. The voltage controlled oscillator of claim 5 wherein the third field effect transistor of the second conductivity type allows said first and second voltage controlled resistors to achieve a high dynamic range of resistance for a change in the impedance control voltage.

8. The voltage controlled oscillator of claim 1 wherein the voltage to current bias converter comprises:

a) a first field effect transistor of the first conductivity type to establish the current bias voltage having a source connected to the power supply voltage source, and a gate connected to a drain which is connected to the current bias voltage output terminal;

b) a fourth field effect transistor of a second conductivity type to act as a source follower, having a drain connected to the drain of the first field effect transistor of the first conductivity type, a gate connected to the voltage control terminal, and a source;

c) a resistor coupled between the source of the fourth field effect transistor of the second conductivity type and the ground reference point, such that a voltage is developed at the source of the fourth field effect transistor of the second conductivity type that is equal to the input voltage level less a magnitude of a threshold voltage of the first field effect transistor of the second conductivity type;

d) a second field effect transistor of the first conductivity type that is the minimum current level setting means, having a source connected to the drain of the first field effect transistor of the first conductivity type, a gate connected to a biasing voltage source to establish a constant current through the first field effect transistor of the first conductivity type to establish the minimum for the frequency, and a drain connected to the source of the fourth field effect transistor of the second conductivity type; and e) the current subtraction means comprising:
      a third field effect transistor of the first conductivity type having a source connected to the power supply voltage source, a gate connected to a second biasing voltage source, and a drain,
      a fourth field effect transistor of the first conductivity type having a source connected to the drain of the third field effect transistor of the first conductivity type, a gate connected to the voltage control terminal, and a drain, and
      a fifth field effect transistor of the second conductivity type having a drain connected to the drain of the fourth field effect transistor of the first conductivity type, a gate connected to the voltage control terminal, and a source connected to the fourth field effect transistor of the second conductivity type.

9. The voltage controlled oscillator of claim 1 wherein the replica biasing circuit comprises:

a) a single differential delay element having a positive input terminal connected to the ground reference point and a negative input terminal connected to the voltage reference input port; and b) a differential amplifier to produce the impedance control voltage, having an inverting terminal connected to the voltage reference port, a noninverting terminal connected to the negative output terminal of the single differential delay element, and an output terminal connected to the impedance voltage control terminal of the voltage controlled resistors, wherein the impedance control voltage is at a level such that the voltage at the output terminal of the differential delay element is equal to the value of the stable reference voltage.

10. The voltage controlled oscillator of claim 1 wherein the comparator comprises:

a) a first and a second input amplifier circuit configured to form a difference amplifier circuit wherein each amplifier has an amplifier input terminal, an amplifier output terminal a current supply terminal, and a ground terminal connected to the ground reference point;

b) an amplifier current source coupled between the power supply voltage source and the current supply terminals of the first and second input amplifier circuits to provide an amplifying current for the differential amplifier circuit;

c) a first input capacitor coupled between the positive input terminal of the differential input port and the amplifier input terminal of the first input amplifier;

d) a second input capacitor coupled between the negative input terminal of the differential input port and the amplifier input terminal of the second input amplifier; and e) a first and a second driver amplifier circuit to provide a sufficient signal level to transfer the output signal to external circuitry, wherein the first driver amplifier circuit has a driver input terminal connected to the amplifier output terminal of the first input amplifier circuits, a driver output terminal connected to the negative output signal terminal, a voltage supply terminal connected to the power supply voltage source, and a ground terminal connected to the ground reference point, and wherein the second driver amplifier circuit has a driver input terminal connected to the amplifier output terminal of the second input amplifier circuits, a driver output terminal connected to the positive output signal terminal, a voltage supply terminal connected to the power supply voltage source, and a ground terminals connected to the ground reference point.

11. The voltage controlled oscillator of claim 7 wherein the first and second amplifier circuits further comprise:

a) a fifth field effect transistor of the first conductivity type having a source connected to the current supply terminal, a gate connected to the amplifier input terminal, and a drain connected to the amplifier output terminal;

b) a sixth field effect transistor of the second conductivity type having a gate terminal connected to the amplifier input terminal, and a drain connected to the amplifier output terminal; and c) a seventh field effect transistor of the second conductivity type to bias the fifth field effect transistor of the first conductivity type and the sixth field effect transistor of the second conductivity type to a high gain region of operation, having a gate connected to a third biasing voltage source, and a drain connected to the gate of the fifth field effect transistor of the first conductivity type and the sixth field effect transistor of the second conductivity type.

12. The voltage controlled oscillator of claim 7 wherein the first and second driver amplifiers further comprise:

a) a sixth field effect transistor of the first conductivity type having a gate connected to the driver input terminal, a gate connected to the driver input terminal, and drain connected to the driver output terminal; and b) a eighth field effect transistor of the second conductivity type having a gate connected to the amplifier input terminal, and a drain connected to the driver output terminal.

13. The voltage controlled oscillator of claim 1 wherein the first and the second conductivity type may be selected from the group of conductivity types that include a P-channel and an N-channel construction, and wherein if the first conductivity type is a P-channel construction, the second conductivity type is an N-channel construction and wherein if the first conductivity type is an N-channel construction, the second conductivity type is a P-channel construction.

14. A voltage controlled oscillator, for the creation of an output signal having a frequency that is proportional to a current biasing voltage and an amplitude that is proportional to an impedance control voltage comprising:

a) a differential ring oscillator, to produce a differential oscillating signal having the frequency and an amplitude, comprising:

a current bias port to modify said frequency with a magnitude of a current biasing voltage applied to said current bias port, whereby said current biasing voltage has a minimum level to prevent instability in said differential ring oscillator and has a compensation component to compensate for fluctuations due to variations in manufacturing process, power supply voltage source, and operating temperature, a impedance control port to adjust the amplitude with an impedance control voltage applied to said impedance control port, a differential output port consisting of a positive output terminal and a negative output terminal wherein said differential oscillating signal is placed on said differential output port, and a plurality of serially connected differential delay elements, wherein each differential delay element has a positive input terminal, a negative input terminal, a positive output terminal, a negative output terminal, a current bias input terminal connected to the current bias port, and an impedance control terminal connected to the impedance control port, wherein said differential delay element will create a differential output delay signal between the positive and negative output terminals that is a version of a differential input signal that is delayed in time, and wherein the positive and negative output terminals of a last differential delay element of the plurality of serially connected differential delay elements are cross connected to the positive and negative input terminals of a first differential delay element of the plurality of serially connected differential delay elements; and b) a voltage to current bias converter to convert the input voltage level to the current bias voltage, comprising:

a voltage control terminal to receive the input voltage level, a current bias output terminal connected to the current bias port to transfer to transfer the current bias voltage to said current bias port, a first field effect transistor of the first conductivity type to establish the current bias voltage having a source connected to the power supply voltage source, and a gate connected to a drain which is connected to the current bias voltage output terminal, a fourth field effect transistor of a second conductivity type to act as a source follower, having a drain connected to the drain of the first field effect transistor of the conductivity type, a gate connected to the voltage control terminal, and a source, a resistor coupled between the source of the fourth field effect transistor of the second conductivity type and the ground reference point, such that a voltage is developed at the source of the fourth field effect transistor of the second conductivity type that is equal to the input voltage level less a magnitude of a threshold voltage of the fourth field effect transistor of the second conductivity type, a second field effect transistor of the first conductivity type to establish the minimum level of the current bias voltage, having a source connected to the drain of the first field effect transistor of the first conductivity type, a gate connected to a biasing voltage source to establish a constant current through the first field effect transistor of the first conductivity type to establish the minimum for the frequency, and a drain connected to the source of the fourth field effect transistor of the second conductivity type, and a current subtraction means to perform a subtraction from the constant current to vary the current bias voltage and to create the compensation component, comprising:

a third field effect transistor of the first conductivity type having a source connected to the power supply voltage source, a gate connected to a second biasing voltage source, and a drain, a fourth field effect transistor of the first conductivity type having a source connected to the drain of the third field effect transistor of the first conductivity type, a gate connected to the voltage control terminal, and a drain, and a fifth field effect transistor of the second conductivity type having a drain connected to the drain of the fourth field effect transistor of the first conductivity type, a gate connected to the voltage control terminal, and a source connected to the fourth field effect transistor of the second conductivity type.

15. The voltage controlled oscillator of claim 14 wherein the connecting of the positive and negative output terminals of the last differential delay element to the negative and positive terminals of the first differential delay element will cause a feedback that will create the differential oscillating signal.

16. The voltage controlled oscillator of claim 15 wherein each differential delay element of the plurality of serial connected delay elements comprise:

a) a bias controlled current source to adjust the delay of said differential delay element, having a first terminal connected to the power supply voltage source, a second terminal connected to the current bias input terminal and third terminal;

b) a first differential pair of field effect transistors of a first conductivity type to amplify and delay the differential input signals to form the differential output delay signal wherein a source of each field effect transistor the pair of field effect transistors is connected to the third terminal of the bias controlled current source, a first gate is connected to the positive input terminal, a second gate is connected to the negative input terminal and a first output drain is connected to the negative output terminal and a second output drain is connected to the positive output terminal;

c) a first and a second voltage controlled resistor to control the amplitude of the differential output delay signal, having a first resistor terminal of the first voltage controlled resistor connected to the first output drain, a first resistor terminal of the second voltage controlled resistor connected to the second output drain, a second terminal of the first voltage controlled resistor connected to the ground reference point, a second terminal of the second voltage controlled resistor connected to the ground reference point, a third resistor terminal of the first voltage controlled resistor connected to the impedance control terminal, and a third resistor terminal of the second voltage controlled resistor connected to the impedance control terminal.

17. The voltage controlled oscillator of claim 16 wherein the first and second voltage controlled resistors each further comprise:

a) a first field effect transistor of the second conductivity type having a drain connected to the first resistor terminal, a gate connected to the third resistor terminal, and a source connected to the second resistor terminal;

b) a second field effect transistor of the second conductivity type having a drain and a gate connected to the first resistor terminal and a source; and c) an third field effect transistor of the second conductivity type having a drain connected to the second field effect transistor of the second conductivity type, a gate connected to the third resistor terminal, and a source connected to the second resistor terminal.

18. The voltage controlled oscillator of claim 17 wherein the impedance control voltage adjusts the impedance of the first and third field effect transistors of the second conductivity type.

19. The voltage controlled oscillator of claim 17 wherein the third field effect transistor of the second conductivity type allows said first and second voltage controlled resistors to achieve a high dynamic range of resistance for a change in the impedance control voltage.

20. The voltage controlled oscillator of claim 14 further comprising:

a) a replica biasing circuit to produce the impedance control voltage such that said impedance control voltage is immune to external noise disturbances and variations in the semiconductor manufacturing process, fluctuations in the power supply voltage source, and changes in operating temperature comprising:

a voltage reference input terminal, a current biasing input terminal connected to the current bias output terminal, a control voltage output terminal connected to the impedance control port, wherein said replica biasing circuit, a single differential delay element having a positive input terminal is connected to the ground reference point and negative input terminal connected to the voltage reference input port, a differential amplifier to produce the impedance control voltage, having an inverting terminal connected to the voltage reference port, a noninverting terminal connected to the negative output terminal of the single differential delay element, and an output terminal connected to the impedance voltage control terminal of the voltage controlled resistors, wherein the impedance control voltage is such that the voltage level at the output terminal of the single differential delay element is equal to the value of the stable reference voltage, a control capacitor coupled between the impedance control voltage output terminal and the ground reference point having a value sufficiently large so that the effect of noise disturbances on the impedance control voltage will be effectively decoupled; and b) a voltage reference generator to produce a stable reference voltage that is coupled to the voltage reference input terminal of the replica biasing circuit.

21. The voltage controlled oscillator of claim 15 further comprising:
 a comparator circuit to produce the output signal from the differential oscillating signal, comprising
  a differential input port having a positive input terminal and a negative input terminal connected to the differential output port so as to maximize a response time of the variation of the frequency for a change in the input voltage level and to provide symmetrical loading for said differential ring oscillator to prevent harmonic distortion;
  a positive and a negative output signal terminal connected to external circuitry;
   a first and a second input amplifier circuit configured to form a difference amplifier circuit wherein each amplifier has an amplifier input terminal, an amplifier output terminal a current supply terminal, and a ground terminal connected to the ground reference point;
   an amplifier current source coupled between the power supply voltage source and the current supply terminals of the first and second input amplifier circuits to provide an amplifying current for the differential amplifier circuit;
   a first input capacitor coupled between the positive input terminal of the differential input port and the amplifier input terminal of the first input amplifier;
   a second input capacitor coupled between the negative input terminal of the differential input port and the amplifier input terminal of the second input amplifier; and
   a first and a second driver amplifier circuit to provide a sufficient signal level to transfer the output signal to external circuitry, wherein the first driver amplifier circuit has a driver input terminal connected to the amplifier output terminal of the first input amplifier circuits, a driver output terminal connected to the negative output signal terminal, a voltage supply terminal connected to the power supply voltage source, and a ground terminals connected to the ground reference point, and wherein the second driver amplifier circuit has a driver input terminal connected to the amplifier output terminal of the second input amplifier circuits, a driver output terminal connected to the positive output signal terminal, a voltage supply terminal connected to the power supply voltage source, and a ground terminals connected to the ground reference point.

22. The voltage controlled oscillator of claim 21 wherein the first and second amplifier circuits further comprise:
 a) a fifth field effect transistor of the first conductivity type having a source and a bulk connected to the current supply terminal, a gate connected to the amplifier input terminal, and a drain connected to the amplifier output terminal;
 b) a sixth field effect transistor of the second conductivity type having a gate terminal connected to the amplifier input terminal, and a drain connected to the amplifier output terminal; and
 c) a seventh field effect transistor of the second conductivity type to bias the fifth field effect transistor of the first conductivity type and the sixth field effect transistor of the second conductivity type to a high gain region of operation, having a gate connected to a third biasing voltage source, and a drain connected to the gate of the fifth field effect transistor of the first conductivity type and the sixth field effect transistor of the second conductivity type.

23. The voltage controlled oscillator of claim 21 wherein the first and second driver amplifiers further comprise:
 a) a sixth field effect transistor of the first conductivity type having a gate connected to the driver input terminal, a gate connected to the driver input terminal, and drain connected to the driver output terminal; and
 b) an eighth field effect transistor of the second conductivity type having a gate connected to the amplifier input terminal, and a drain connected to the driver output terminal.

24. The voltage controlled oscillator of claim 14 wherein the first and the second conductivity type may be selected from the group of conductivity types that include a P-channel and an N-channel construction.

* * * * *